United States Patent
Smith et al.

(10) Patent No.: US 11,499,234 B2
(45) Date of Patent: Nov. 15, 2022

(54) LIQUID LOW TEMPERATURE OXIDE

(71) Applicant: Massachusetts Institute of Technology, Cambridge, MA (US)

(72) Inventors: Melissa A. Smith, Cambridge, MA (US); Bradley P. Duncan, Andover, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 21 days.

(21) Appl. No.: 16/815,114

(22) Filed: Mar. 11, 2020

(65) Prior Publication Data

US 2020/0291530 A1    Sep. 17, 2020

Related U.S. Application Data

(60) Provisional application No. 62/816,551, filed on Mar. 11, 2019.

(51) Int. Cl.
*C23D 5/02* (2006.01)
*H01L 23/29* (2006.01)

(52) U.S. Cl.
CPC .............. *C23D 5/02* (2013.01); *H01L 23/291* (2013.01)

(58) Field of Classification Search
CPC ........................................................ C23D 5/02
See application file for complete search history.

(56) References Cited

U.S. PATENT DOCUMENTS

| | | | |
|---|---|---|---|
| 6,455,100 B1* | 9/2002 | Heimann | B22D 19/0054 427/104 |
| 8,076,185 B1 | 12/2011 | Lower et al. | |
| 8,084,855 B2 | 12/2011 | Lower et al. | |
| 8,119,040 B2 | 2/2012 | Lower et al. | |
| 8,166,645 B2 | 5/2012 | Wilcoxon et al. | |
| 8,363,189 B2 | 1/2013 | Sampica et al. | |
| 8,581,108 B1 | 11/2013 | Boone et al. | |
| 8,617,913 B2 | 12/2013 | Lower et al. | |
| 8,637,980 B1 | 1/2014 | Lower et al. | |
| 8,664,047 B2 | 5/2014 | Lower et al. | |
| 9,565,758 B2 | 2/2017 | Lower et al. | |
| 10,851,251 B2 | 12/2020 | Fedynyshyn et al. | |
| 2001/0027735 A1* | 10/2001 | Doumet | C04B 28/26 106/613 |
| 2007/0275231 A1* | 11/2007 | Meyer | B32B 17/10036 428/325 |
| 2012/0281292 A1* | 11/2012 | Baca | G02B 1/113 359/601 |

(Continued)

OTHER PUBLICATIONS

Barbe, et al., "Low Temperature Bonding of Ceramics by Sol-Gel Processing;" Journal of Sol-Gel Science and Technology, vol. 19; Dec. 2000; 4 Pages.

(Continued)

*Primary Examiner* — Nathan H Empie
(74) *Attorney, Agent, or Firm* — Daly, Crowley, Mofford & Durkee, LLP (57) ABSTRACT

In some embodiments, a method of forming a structure includes: forming a liquid oxide material at a low temperature by dissolving fumed nanoparticles in a liquid hydrate of a silicate or an aluminate; applying the liquid oxide material on a substrate; and at a low temperature, curing the liquid oxide material to evolve gaseous water, leaving structural silicate glass.

11 Claims, 13 Drawing Sheets

(56) References Cited

U.S. PATENT DOCUMENTS

2019/0300741 A1 10/2019 Duncan et al.
2020/0353682 A1 11/2020 Fedynyshyn et al.

OTHER PUBLICATIONS

Desert Silicon Spin-On Glass NDG-7000; Retrieved from http://desertsilicon.com/wp-content/uploads/Data-Sheet-NDG-7000-2.pdf on Jul. 23, 2020; 2 Pages.

Destino, et al., "3D Printed Optical Quality Silica and Silica-Titania Glasses from Sol-Gel Feedstocks;" Advanced Materials Technologies; Jan. 8, 2018; 10 Pages.

Dupont Spin-On Dialectrics; Retrieved from https://www.dupont.com/electronic-materials/spin-on-dielectrics.html on Jul. 23, 2020; 2 Pages.

Hillman, et al., "Alkali Silicate Glass Coatings for Mitigating the Risks of Tin Whiskers;" Journal of Electronic Materials; Sep. 2015; 20 Pages.

Inamura, et al., "Additive Manufacturing of Transparent Glass Structures;" 3D Printing and Additive Manufacturing, vol. 5, No. 4; Dec. 17, 2018; 16 Pages.

Kalkowski, et al., "Silicate and Direct Bonding of Low Thermal Expansion Materials;" SPIE Digital Library; Sep. 30, 2013; Downloaded from https://www.spiedigitallibrary.org/conference-proceedings-of-spie on Mar. 6, 2019; 12 Pages.

Kim, et al., "Shear Strength Evaluation of Hydroxide Catalysis Bonds for Glass-Glass and Glass-Aluminum Assemblies;" Precision Engineering, vol. 37; Jul. 7, 2012; 10 Pages.

Kotz, et al., "Three-Dimensional Printing of Transparent Fused Silica Glass;" Nature, vol. 544; Apr. 20, 2017; 6 Pages.

Lower, et al., "Alkali Silicate Glass Based Thermal Coatings;" 2010 26th Annual IEEE Semiconductor Thermal Measurement and Management Symposium (SEMI-THERM); Feb. 21, 2010; 7 Pages.

Pelco Technical Notes; Pelco High Performance Silver Paste, 50g, Product No. 16047; Retrieved from https://www.tedpella.com/technote_html/16047-TN-V1-06232009.pdf on Jul. 23, 2020; 3 Pages.

Preval Spray Instructions; Retrieved from www.preval.com on Jul. 23, 2020; 3 Pages.

Reid, et al., "Influence of Temperature and Hydroxide Concentration on the Settling Time of Hydroxy-Catalysis Bonds;" Physics Letters A, vol. 363; Dec. 5, 2006; 5 Pages.

Satoh, et al., "Water Glass Bonding;" Sensors and Actuators, vol. A72; Sep. 4, 1998; 9 Pages.

Sivasankar, et al., "Optical Bonding Using Silica Nanoparticle Sol-Gel Chemistry;" Nano Letters, vol. 7, No. 10; Jun. 22, 2007; 4 Pages.

Ted Pella, Inc. Conductive Adhesives Comparison Table; Retrieved from https://www.tedpella.com/adhesive_html/adhesive-comparison.htm on Jul. 23, 2020; 2 Pages.

* cited by examiner

LIQUID LOW TEMPERATURE OXIDE

CROSS-REFERENCE TO RELATED APPLICATIONS

This application claims the benefit under 35 U.S.C. § 119 of provisional patent application No. 62/816,551 filed Mar. 11, 2019, which is hereby incorporated by reference herein in its entirety.

STATEMENT REGARDING FEDERALLY SPONSORED RESEARCH

This invention was made with government support under FA8702-15-D-0001 awarded by the U.S. Air Force. The government has certain rights in the invention.

BACKGROUND

Oxide materials for complex structures, such as silicon wafers, and their processing techniques may be evaluated along three different axes. First, various applications may require structures to have a sufficient strength. Second, applications may require structures to be operative in extreme environments, such as high-temperature or oxidizing environments. Third, applications may require structures to be manufactured cost-effectively at low temperature.

Various coatings have been developed that are simultaneously sufficient according to only two of these three axes. For example, Spin-On Glass NDG-7000 by Desert Silicon, Inc. of Tempe, Ariz. and the various FOX® Flowable Oxides by Dow Corning of Midland, Mich. are both operative in extreme environments and use low-temperature processes, but the resulting coatings are too thin to provide sufficient structure for some applications. Similarly, additive 3D printing techniques such as binder jetting and stereolithography are operative in extreme environments and provide sufficient structure, but the process temperature is too high for certain fabrication settings. Likewise, structural surface treatments that may be processed at a relatively low temperature, using materials like Kapton® polyimide film by DuPont of Wilmington, Del., ACCUGLASS® by Honeywell International Inc. of Charlotte, N.C., or SU-8 by MicroChem Corp. of Westborough, Mass. are not suitable for the high temperature or oxidizing environments demanded by some applications.

SUMMARY

Disclosed embodiments provide a liquid low-temperature oxide (LLTO) suitable for providing inorganic structures that are formed at low temperatures for harsh, extreme environments. Also disclosed are various methods of preparing and applying LLTO, including methods for to form structures using LLTO, methods for 3D printing using LLTO, and methods of constructing semiconductor wafers using LLTO. The viscosity of the LLTO is adjustable over several orders of magnitude by varying its chemical composition, permitting application to the substrate using a variety of techniques. The curing rate of the LLTO structure is also adjustable.

According to one aspect of the present disclosure, a method of forming a structure can include: forming a liquid oxide material at a low temperature by dissolving fumed nanoparticles in a liquid hydrate of a silicate or an aluminate; applying the liquid oxide material on a substrate; and at a low temperature, curing the liquid oxide material to evolve gaseous water, leaving structural silicate glass.

According to another aspect of the present disclosure, a method can include: forming a material at low temperature by dissolving fumed nanoparticles in a oxide precursor; applying the material on a substrate; and at a low temperature, curing the material to evolve gaseous water, leaving structural silicate glass.

In some embodiments, forming the liquid oxide material can include dissolving a solid oxide solute of silicon, or of titanium, or of aluminum, or of any combination of such solutes. In some embodiments, forming the liquid oxide material can include dissolving fumed nanoparticles in a liquid hydrate of sodium metasilicate or of ammonium silicate or of sodium aluminate. In some embodiments, forming the liquid oxide material can include adding a functional additive. In some embodiments, the functional additive may include at least one of a ceramic, metal, glass, salt, or polymer filler material. In some embodiments, applying the liquid oxide material on the substrate can include drop casting, or spin coating, or spray coating, or 3D printing, or injection molding. In some embodiments, the liquid oxide material may be formed at a temperature in the range of 1° to 150° C. In some embodiments, the liquid oxide material can be formed at a temperature in the range of 20° to 70° C.

According to another aspect of the present disclosure, a structure may include: a substrate; and a silicate glass applied over the substrate, the silicate glass formed and applied as a liquid oxide material at a low temperature by dissolving fumed nanoparticles in a liquid hydrate of a silicate or an aluminate.

It is appreciated that the concepts, techniques, and structures disclosed herein may be applied using different chemicals, and in different modes.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

As used herein, a "low temperature" is a temperature in the range of about 1° to about 150° C., and preferably in the range of about 20° to about 70° C. A "low-temperature" process is a process performed at a temperature in said range or ranges. It is appreciated that different manufacturing processes may consider other ranges "low-temperature", and these ranges are merely illustrative unless specified otherwise.

As used herein, an "extreme" operating environment is one that either is oxidizing, has a high temperature during use (and in particular, a temperature higher than the low-temperature process used to coat the substrate), or both. It is further appreciated that, in the context of some applications not discussed herein, other operating conditions may be considered "extreme" by a person having ordinary skill in the art.

As used herein, the terms "weight percentage" and "wt. %" mean, as applied to a solute in solution, 100 times the ratio of the mass of the solute to the total mass of the solution.

Figure 1:
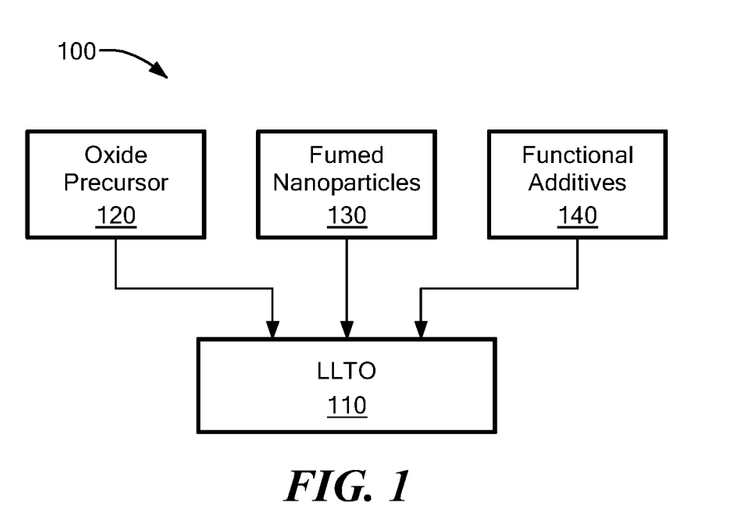
FIG. 1 is a diagram of a process for providing a liquid low-temperature oxide (LLTO) material, according to some embodiments.

FIG. 1 shows an illustrative process 100 for providing a liquid low-temperature oxide (LLTO) material, according to some embodiments. LLTO material 110 can be synthesized or otherwise provided from a combination of an oxide precursor 120, fumed nanoparticles 130, and functional additives 140. In an embodiment, the oxide precursor 120 may comprise at least one of sodium silicate, ammonium silicate, or sodium aluminate. The fumed nanoparticles 130 may comprise at least one of silica, titania, or alumina.

Functional additives (or "fillers") 140 can be optionally used to achieve various structure properties and characteristics. Functional additives 140 can include, for example, ceramic, metal, glass, salt, and/or polymer filler material. Non-limiting examples of additives 140 include tungsten, silver (e.g., Ag flakes), titanium oxide, aluminum oxide, metal ions, high dielectric material, carbon fiber, magnetic material, and ceramic material. The particular additive or additives used may depend upon the needs/requirements of a particular application. For example, tungsten or silver additives may be used in high temperature conductor applications. As another example, an additive may be used to provide a desired coating density. As another example, a high dielectric filler can be used when forming antenna structures. As yet another example, carbon fibers can be added to produce a glass with an anisotropic mechanical response due to the 3D printing direction.

In an embodiment, the LLTO material 110 is provided by dissolving the fumed nanoparticles in the oxide precursor. In some embodiments, LLTO material 110 may be provided according the following chemical equation:

$Na_2SiO_3 \cdot xH_2O_{(l)} + SiO_{2(s)} + \text{functional additive}_{(s)}$
$\rightarrow LLTO_{(s)} + xH_2O_{(v)}$ As will be described below, the disclosed combination of oxide precursor 120, fumed nanoparticles 130, and functional additives 140 results in an inorganic LLTO material 110 that is curable using a low-temperature process, but is operative in extreme environments and has viscosity and curing rate characteristics which are tunable. Such a material finds use in a wide variety of applications including, but not limited to microfabrication, 3D printing, additive manufacturing and semiconductor wafer fabrication (including, but not limited to gap filling and wafer reconstruction).

In some embodiments, the weight percentage of the fumed nanoparticles 130 may be in the range 0.05 to 35 wt. % and the weight percentage of the functional additives 140 may be in the range 0.05 to 90 wt. %. The remainder would be made up using a solution of the oxide precursor 120.

With respect to LLTO viscosity characteristics, the viscosity of LLTO solutions can be varied (or "tuned") over a wide range. This can be done by controlling the loading of fumed nanoparticles 130 (e.g., fumed silica) in the formulation. The viscosity of an LLTO solution can be selected to suit the needs of a particular application or to suit the needs of a particular application process (e.g. to achieve a desirable result using a particular process for applying LLTO).

For example, in one illustrative embodiment, an effective solution for applying by spin-coating contained 1.5 wt. % of fumed silica in reagent grade sodium silicate solution. Ten grams of a solution (for example) can be made as follows. First, about 0.150 grams of fumed silica (solute) can be weighed into a vial. Next, about 9.850 grams of reagent-grade silicate (solvent) can be added to the vial. Then, the components can be mixed to form the LLTO solution. The resulting solution may have about 1.5% by weight solute.

As another example, to create an effective 3D printing ink, a loading of 15 wt. % of fumed silicate may be required. This increase in solids loading introduces a yield stress into the material, a characteristic which is sometimes desirable for generating self-supporting 3D printing filaments. The fumed silica also introduces a shear-thinning behavior to the solution, which is sometimes another desirable factor in direct-write 3D printing.

In view of the above discussion, it is appreciated that a variety of modes of coating application may be more effective at different viscosities, and that disclosed LLTO materials may be used as a coating with these different modes by varying the mass fraction of the dissolved solute.

With respect to LLTO curing rate characteristics, the curing rate of silicate systems possess both a temperature and hydroxide ion dependence. In illustrative embodiment curing rates were altered by controlling solids loading and substrate temperature. Increasing the solids loading and/or increasing the temperature of the substrate decrease the curing rate for LLTO.

Figure 2:
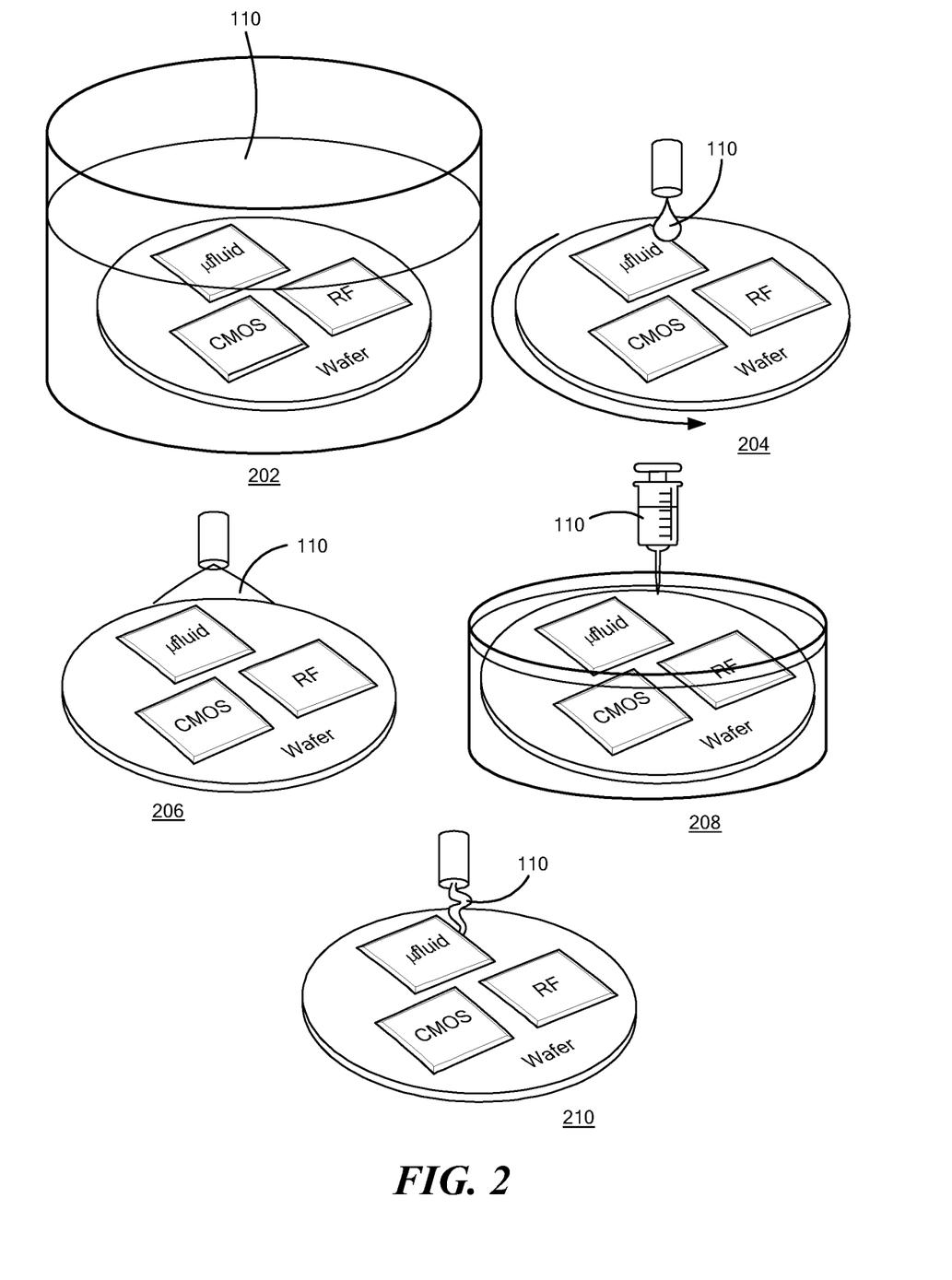
FIG. 2 is a diagram showing various methods of applying LLTO, according to some embodiments.

Turning to FIG. 2, the LLTO material 110 described herein is suitable for use with a variety of techniques including, but not limited to drop-casting 202, spin-coating 204, spray-coating 206, injection molding 208, and three-dimensional (3D) printing 210. Examples of such techniques are described below in conjunction with various parameters of the LLTO materials that may be particularly effective for each techniques.

In some embodiments, the LLTO 110 may be processed with and on materials that do not degrade and/or are stable in hydroxide solutions. In various applications, the LLTO material 110 can be applied as a liquid and cured in situ. For example, using a spin coating technique 204, the LLTO 110 can be applied as a liquid over a substrate, and then cured to form a structural coating over a silicon substrate or other substrate.

Figure 3A:
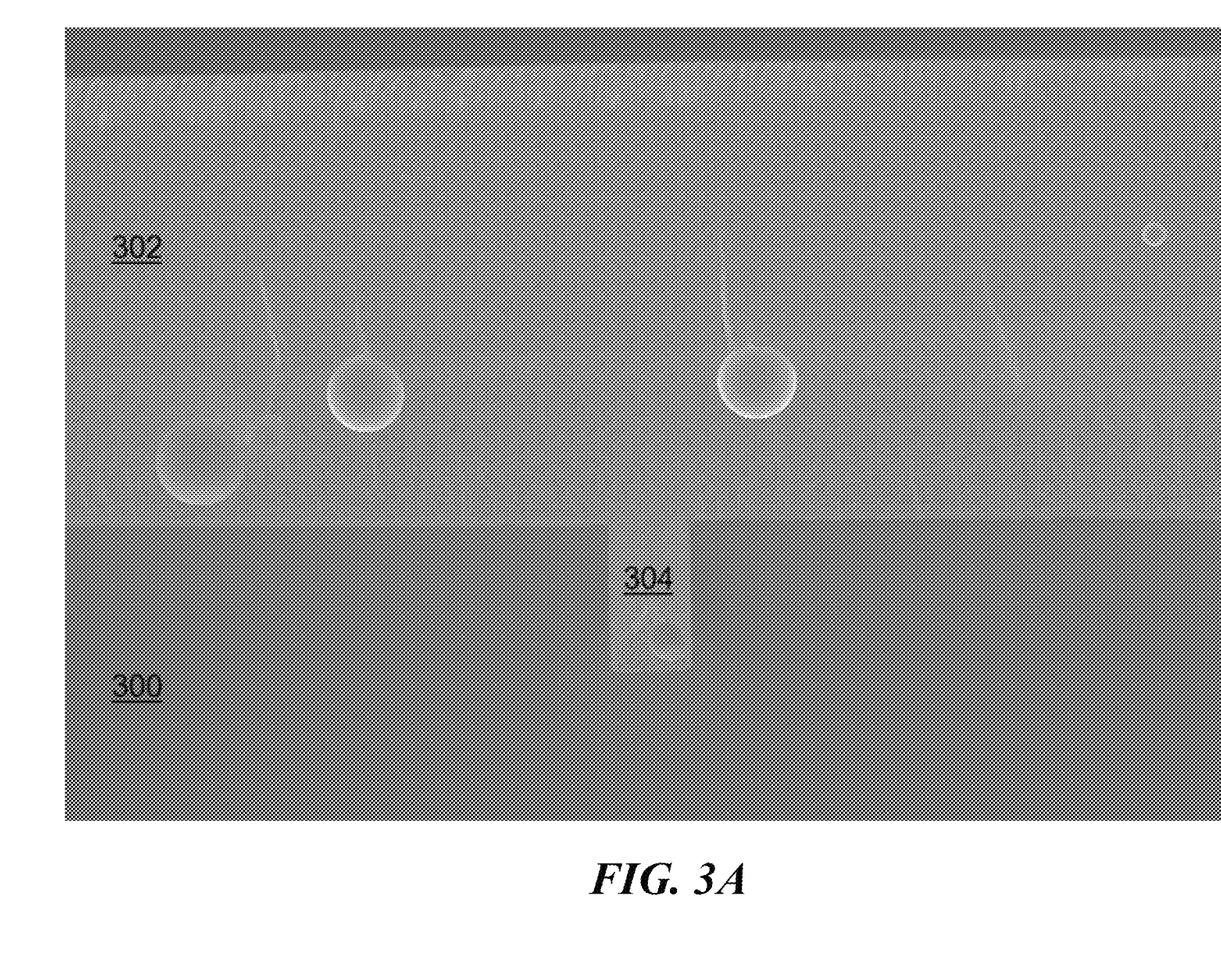
FIGS. 3A-3C are a series of photographs showing LLTO applied over a substrate using a drop-casting process, according to some embodiments.
Figure 3B:
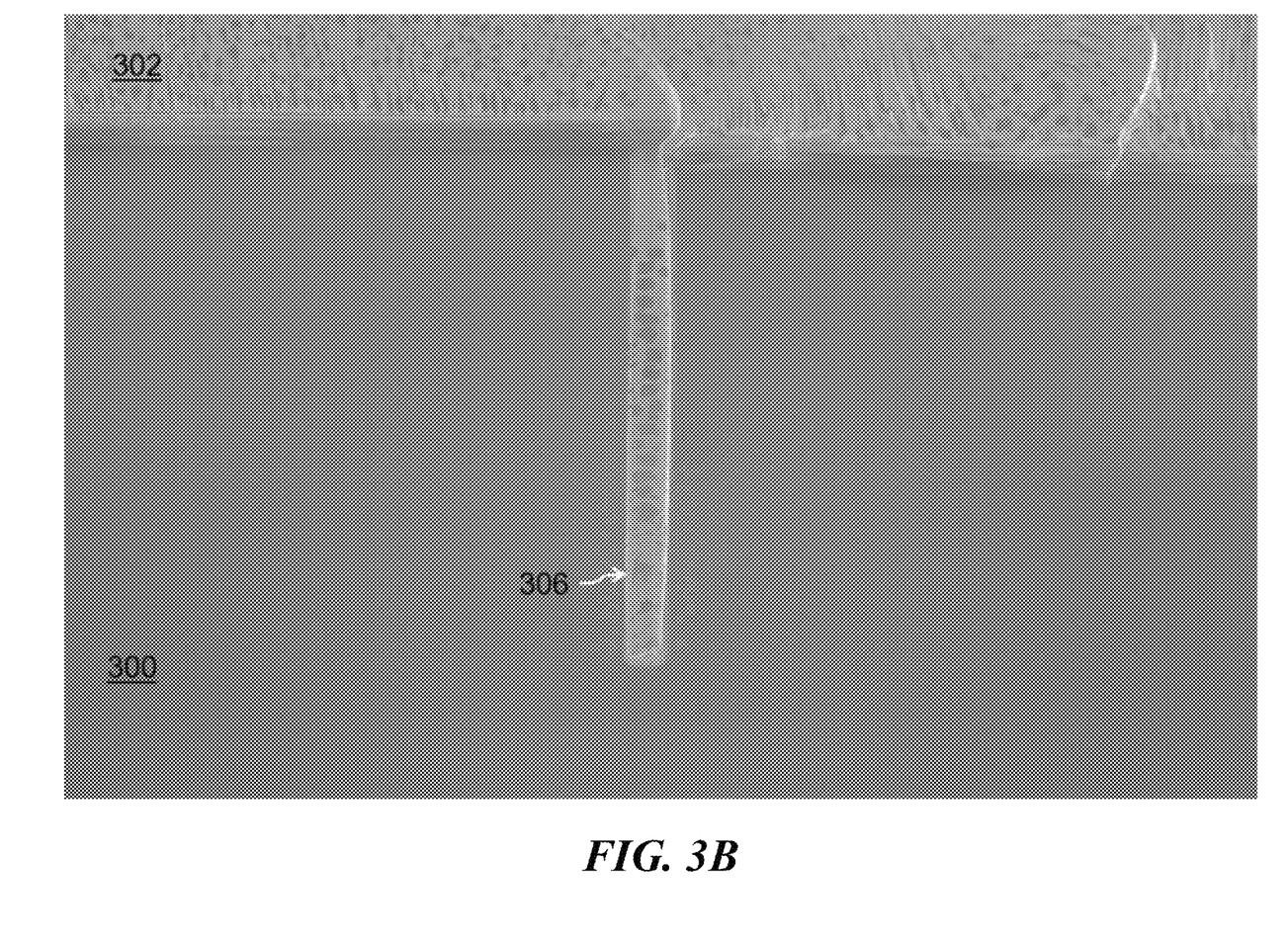
Figure 3C:
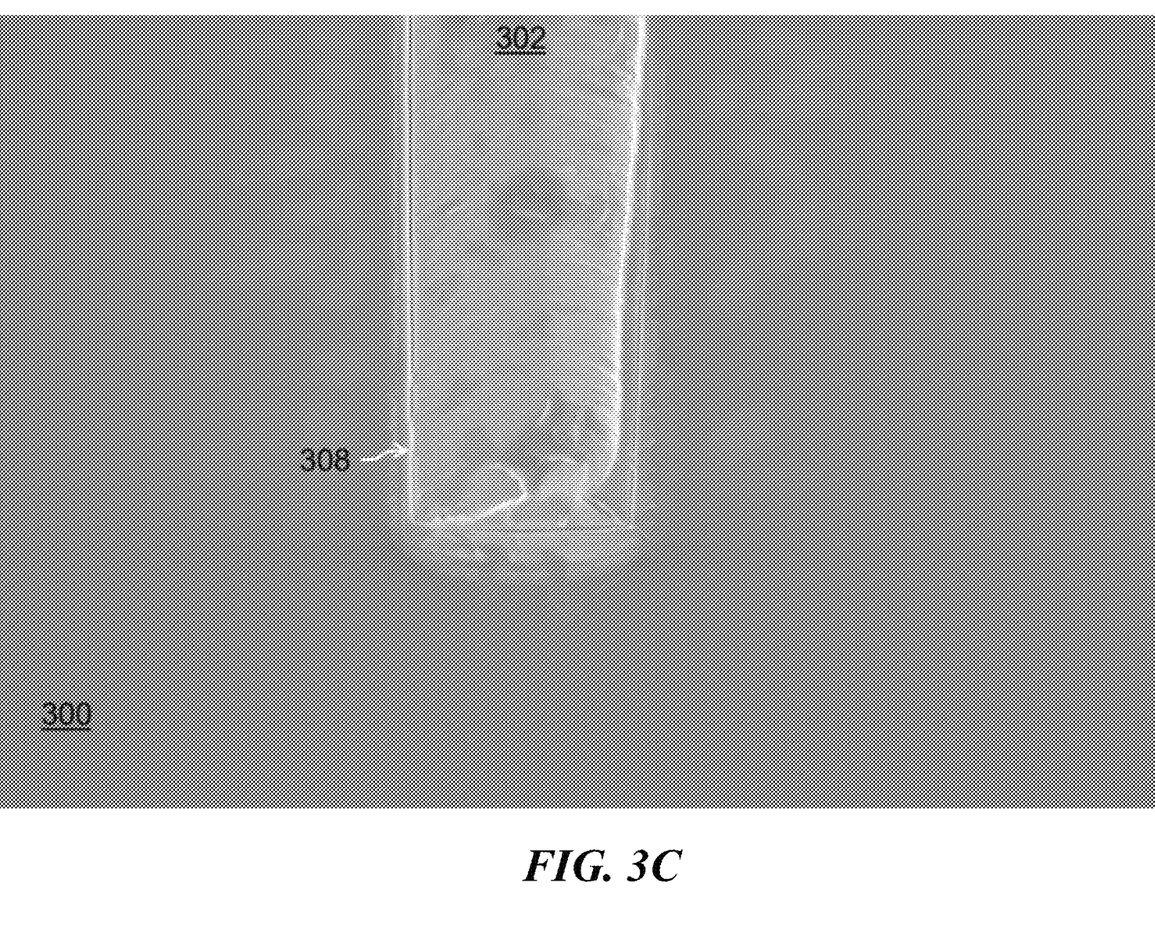

FIGS. 3A-3C show an LLTO material 302 applied as a coating over a substrate 300 using drop-casting. Drop casting is a technique were a solution is drop onto a surface, where by the solution can spread spontaneously. This method can accommodate a variety of viscosity and compositions and is inexpensive. Casting can be performed pouring a predetermined volume of the LLTO on to a flat surface or into a mold, then cured to form a solid. In some embodiments, temperature can be applied to reduce curing time. The cured solid part can be released from the surface or mold as needed. In some embodiments, a solute of Aerosil 50 by Evonik Industries of Essen, Germany may be used. The Aerosil 50 may be loaded into an effective solution between 0.5 wt. % and 20 wt. %. It is appreciated that other solutes may be used in other weight percentage ranges for other embodiments.

As seen in FIG. 3A-3C, the LLTO material 302 can fill in microfabricated cavities 304, 306, 308, respectively, in the substrate while also providing a structural coating over the substrate 300. That is, the LLTO material 302 can be disposed in cavities (or "gaps") in the substrate 300 to act as a fill. In some embodiments, the LLTO material is capable of filling cavities having a depth-to-width aspect ratio of about 13:1.

Figure 4A:
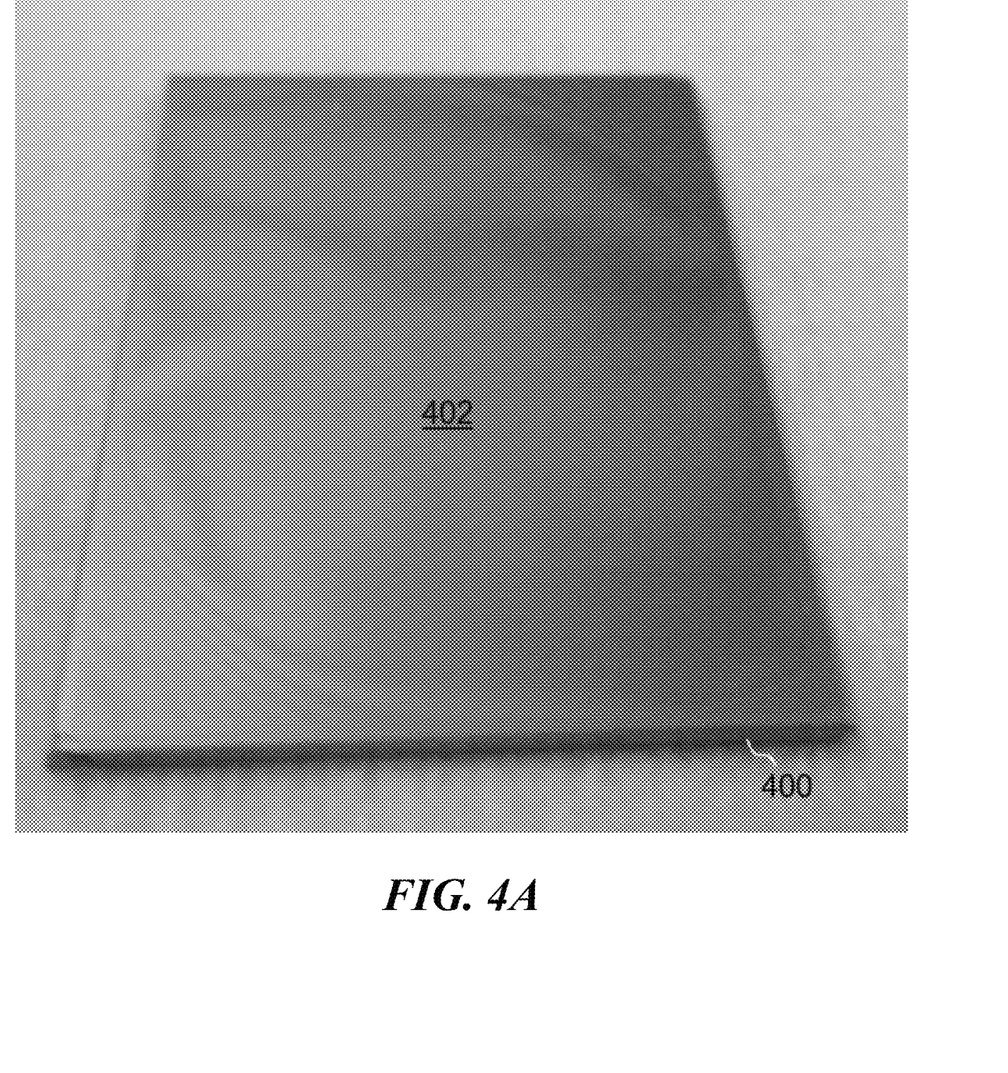
FIGS. 4A-4C are a series of photographs showing an LLTO material applied as a coating over a substrate using a spin coating technique, according to some embodiments.
Figure 4B:
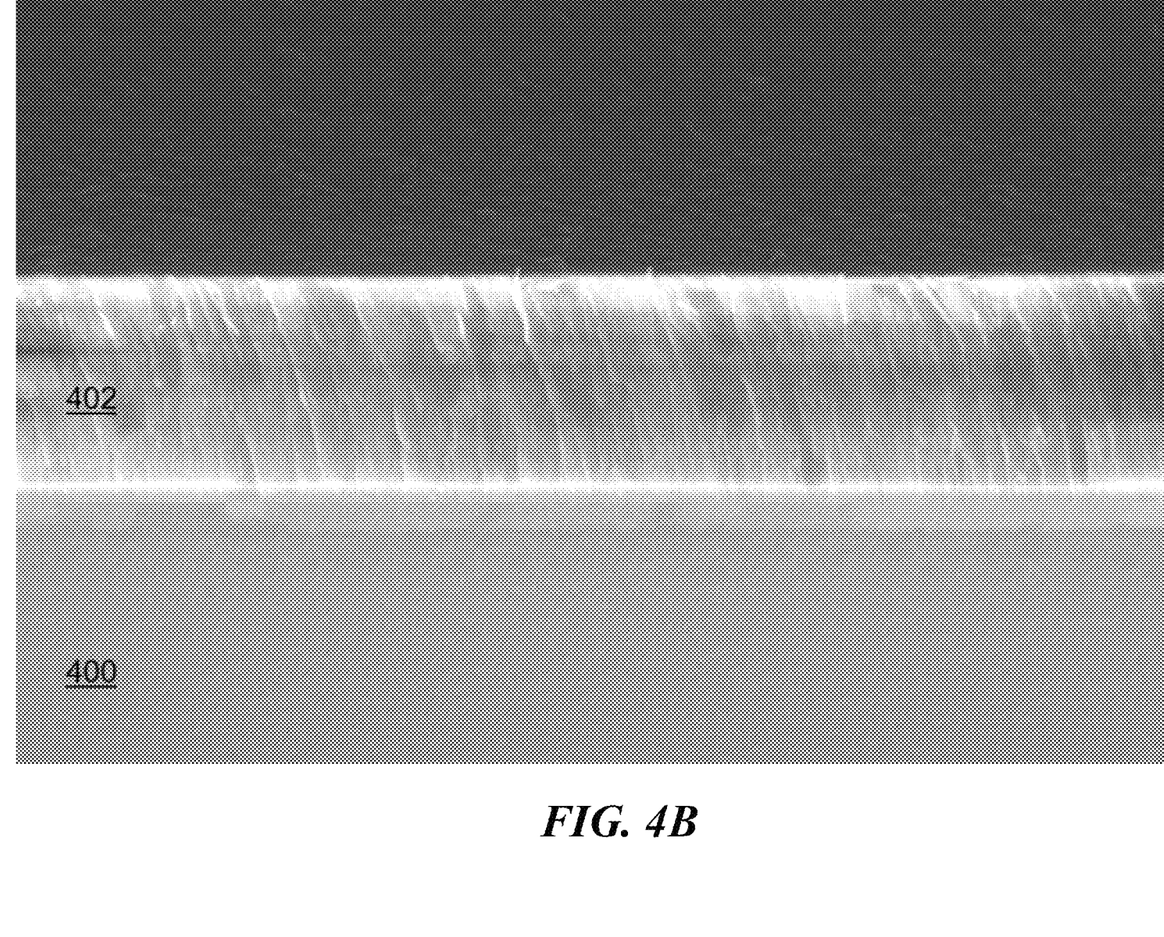
Figure 4C:
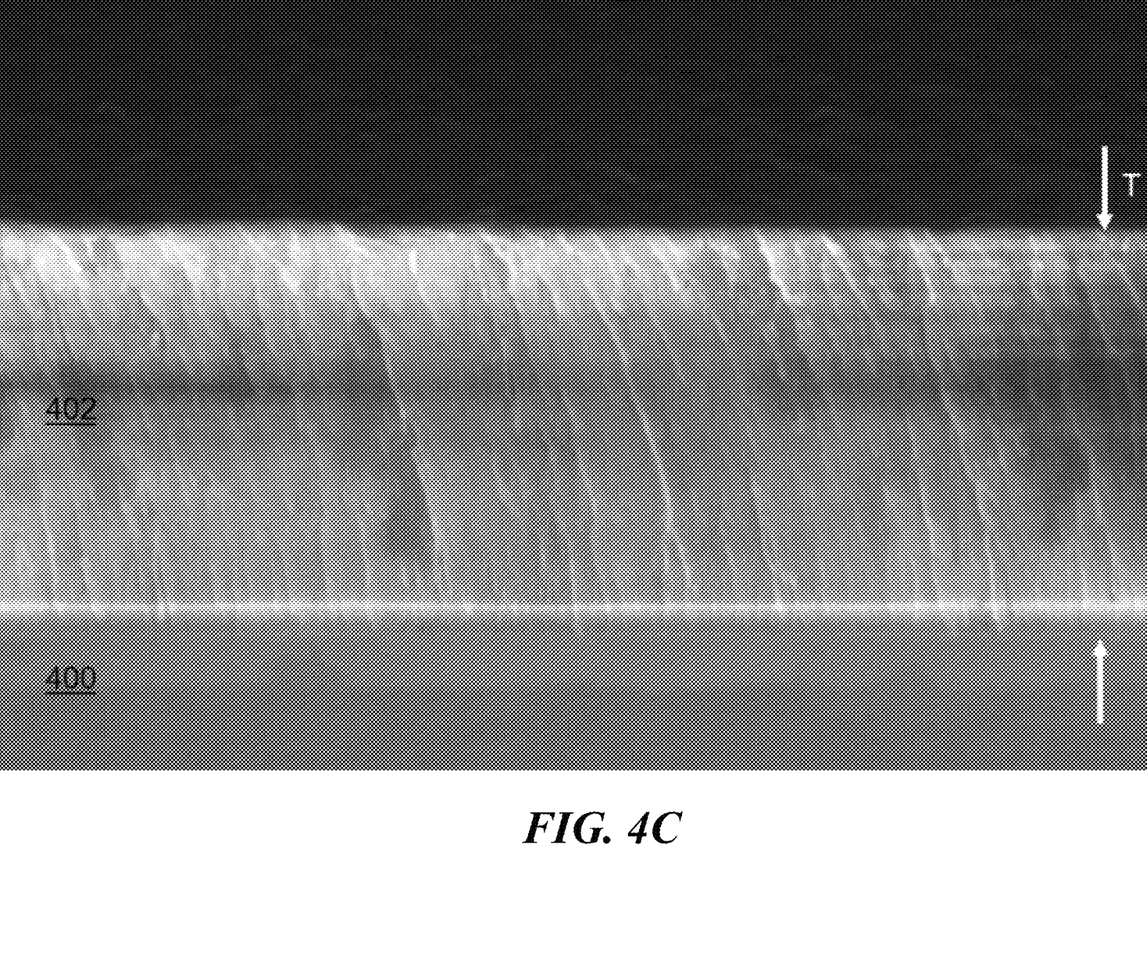

FIGS. 4A-4C show an LLTO material 402 applied as a coating (or "film") over a substrate 400 using a spin coating. Spin coating (also referred to as spin casting) is a technique whereby a solution is dispensed on a surface that is either rotating or begins to rotate. The centripetal forces created due to the rotating surfaces shears and spreads the solutions across the surfaces. The resulting film is very uniform in thickness, which can be precisely controlled by the surface spin speed and solution viscosity.

In one example, a Laurell WS series spin coater can be used to coat 2 inch silicon wafers with LLTO. Starting with a stationary wafer, the LLTO material can be applied to coat 70% of the wafer's surface. Next, the wafer may be spun up to a predetermined spin speed with an acceleration of 500 rpm per second. A wafer may be spun at the predetermined speed for 60 seconds, and then baked on a hot plate at 90° C. for about 60 seconds. The viscosity of the LLTO material can be tuned by the inclusion of fumed silica nanoparticles. The spin speed may be adjusted to obtain various film thicknesses and strengths.

As illustrated in FIG. 4A-4C, LLTO film can be planar and dense, according to some embodiments. In the example of FIG. 4C, the thickness T of the LLTO can be about 2.876 microns.

Figure 5:
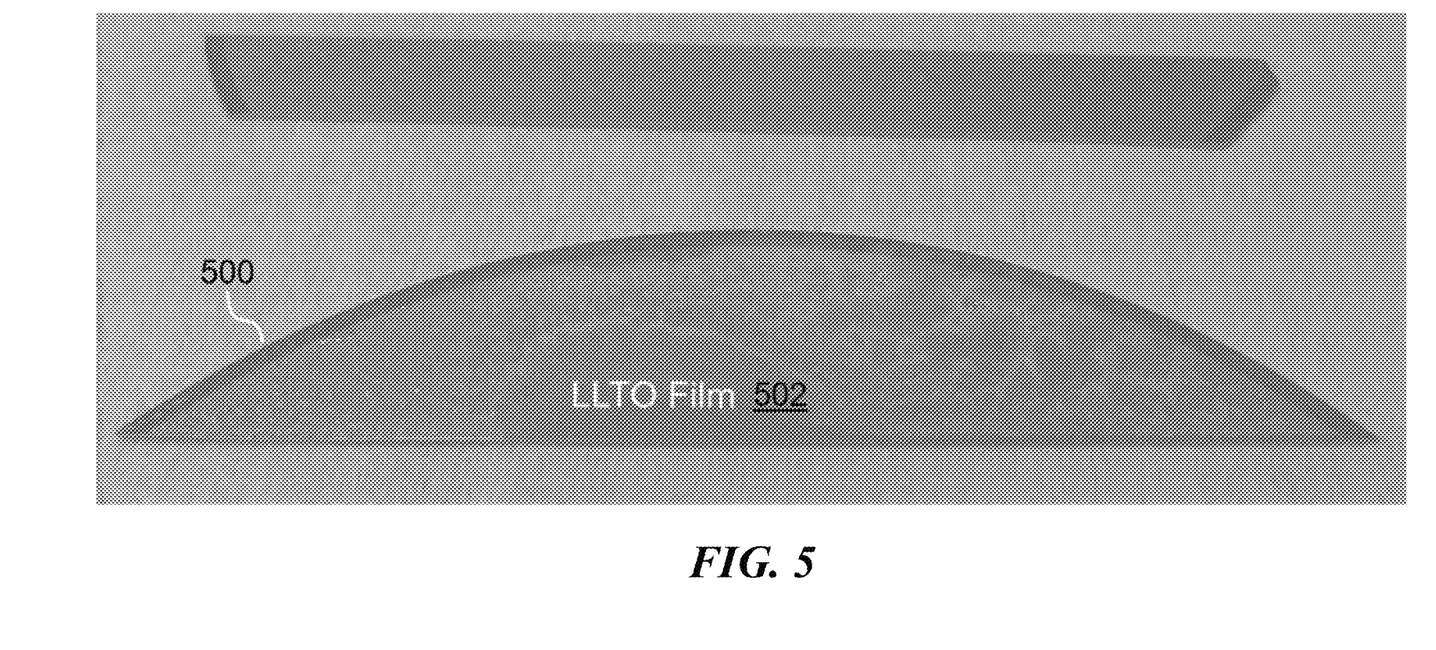
FIG. 5 is a photograph showing an LLTO film formed over a substrate using a spray coating technique, according to some embodiments.

FIG. 5 is a photograph showing an LLTO coating (or "film") 502 formed over a substrate 500 using spray coating. Spray coating is a technique where pressure and impact are used to transform a liquid to a spray via a process known as atomization. This approach can be used to coat large areas with the atomized liquid and increase liquid to surface area to volume ratio for faster curing and drying. In some embodiments, the LLTO material may be spray coated using a Preval sprayer that can atomize a wide variety of liquids. The sprayer may be filled with and LLTO solutions that had a low enough viscosity to allow a spray. In one example, the solute of Aerosil 200 (an illustrative fumed nanoparticle by Evonik) may be used, with a loading of 1.5 wt. % (i.e. 0.150 grams of Aerosil 200 in 9.85 grams of reagent grade silicate solution). Spray coating can be used to readily apply a thermal oxide film over a silicon substrate. In one example, the thermal oxide film can have a thickness of about 100 nm.

Figure 6A:
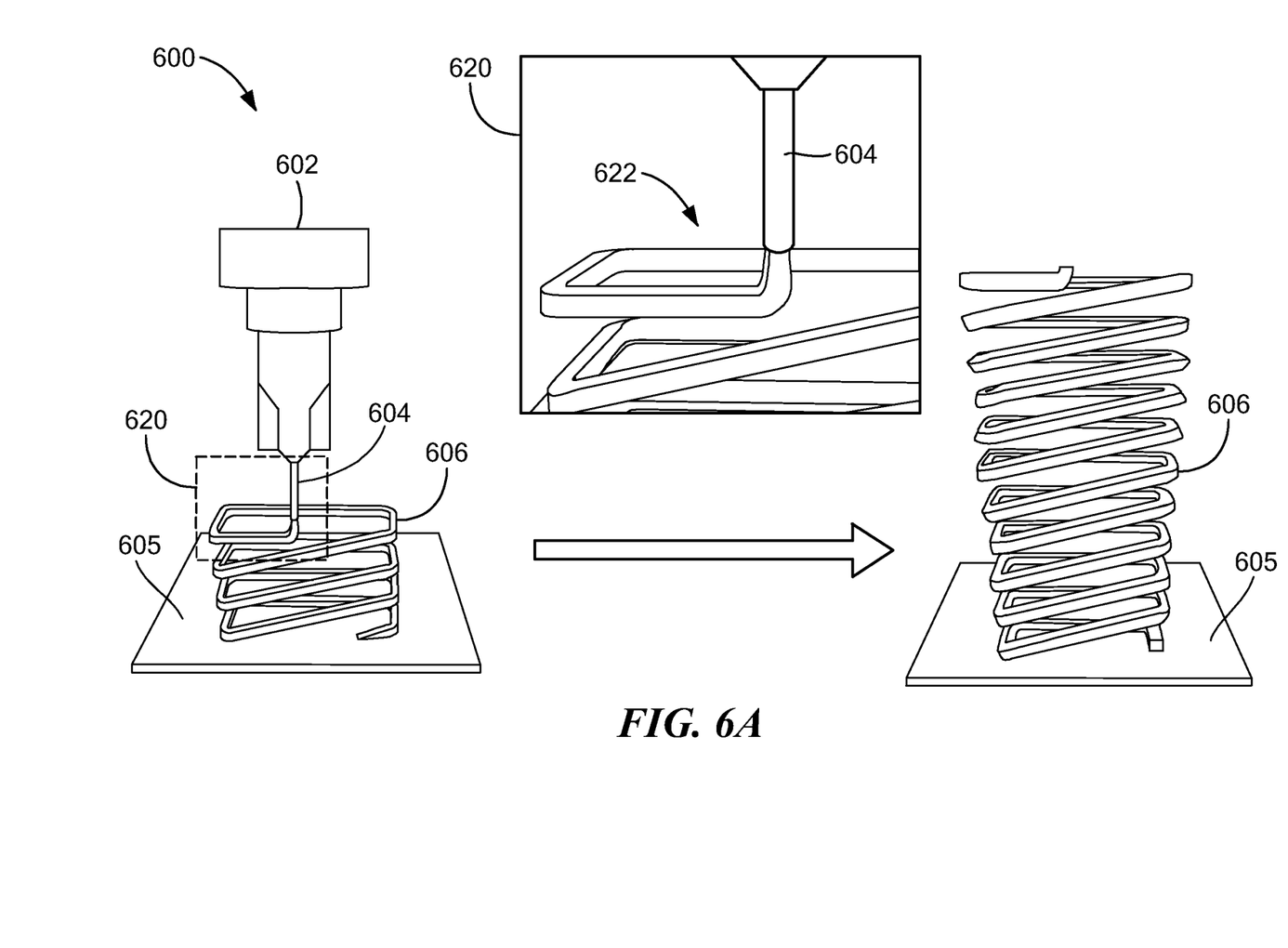
FIG. 6A is a diagram showing LLTO used in a 3D printing application, according to some embodiments.

Turning to FIG. 6A, according to some embodiments, a LLTO material disclosed herein can be used in a 3D printing application 600. Direct-write 3D printing is an additive manufacturing technique where inks is extruded out of deposition nozzle 604 onto a substrate 605. Multiple layers can be built up to form 3-dimensional structures or objects, such as representative printed structure 606 of FIG. 6A.

For 3D printing, an LLTO material (or "ink") can be formed by weighing out ingredients into a polypropylene mixing container. In one example, the ink formulation can include a functional particle component (e.g. silver flakes to provide conductivity), a fumed nanoparticle component to tuned ink rheology, and silicate solution to generate the final glass structure.

The LLTO ink may be generated using mixer, such as a Speedmixer 600 Vac DL planetary mixer provided by Flacktek or Landrum SC). In one example, the ink can be mixed for 2 cycles of 30 seconds at 800 RPM, 30 seconds at 1400 RPM, and 4 minutes at 2000 RPM. The ink can be loaded into syringes (e.g., 3 mL luer-lock polypropylene syringes) and centrifuged (e.g., at 3000 RPM for 10 minutes) to remove air bubbles and force ink to the bottom of the syringe barrel. The syringe can be uncapped, loaded into a high-pressure adapter 602 (e.g., a HP 7× high-pressure adapter) and mounted onto a 3-axis gantry system (e.g., a gantry system provided by Aerotech or Pittsburgh, Pa.). The ink can be extruded through a nozzle 604 (e.g., a 200 µm, luer-lock tapered nozzle) using pressurized control. The position of the printing nozzle 604 can be robotically controlled.

In some embodiments, the viscosity of the LLTO ink can range from about $10^6$ (Pa*s) to about 10 (Pa*s) and, preferably, from about $10^5$ (Pa*s) to about $10^2$ (Pa*s). It should be appreciated that the inks are shear thinning and thus the range is both temperature dependent and dependent on applied strain.

In general, 3D printing processes require solids loadings that are higher than those required for drop casting or spray coating processes. The fumed silica loading is dependent on surface area but in general, 3D inks may be provided from 0.5% through 30% by weight. The exact loading may also be dependent on the functional filler chosen for the ink. In one example system, ink can be made with 15 wt. % of Aerosil 200 fumed silica. In another example, ink can be made with 30 wt. % of Aerosil 50.

As seen within inset 620, the material extruded from 3D printer nozzle 604 may be dissolved in a solvent that evaporates 622, leaving a rigid structure 606 (e.g., a rigid glass structure).

Figure 6B:
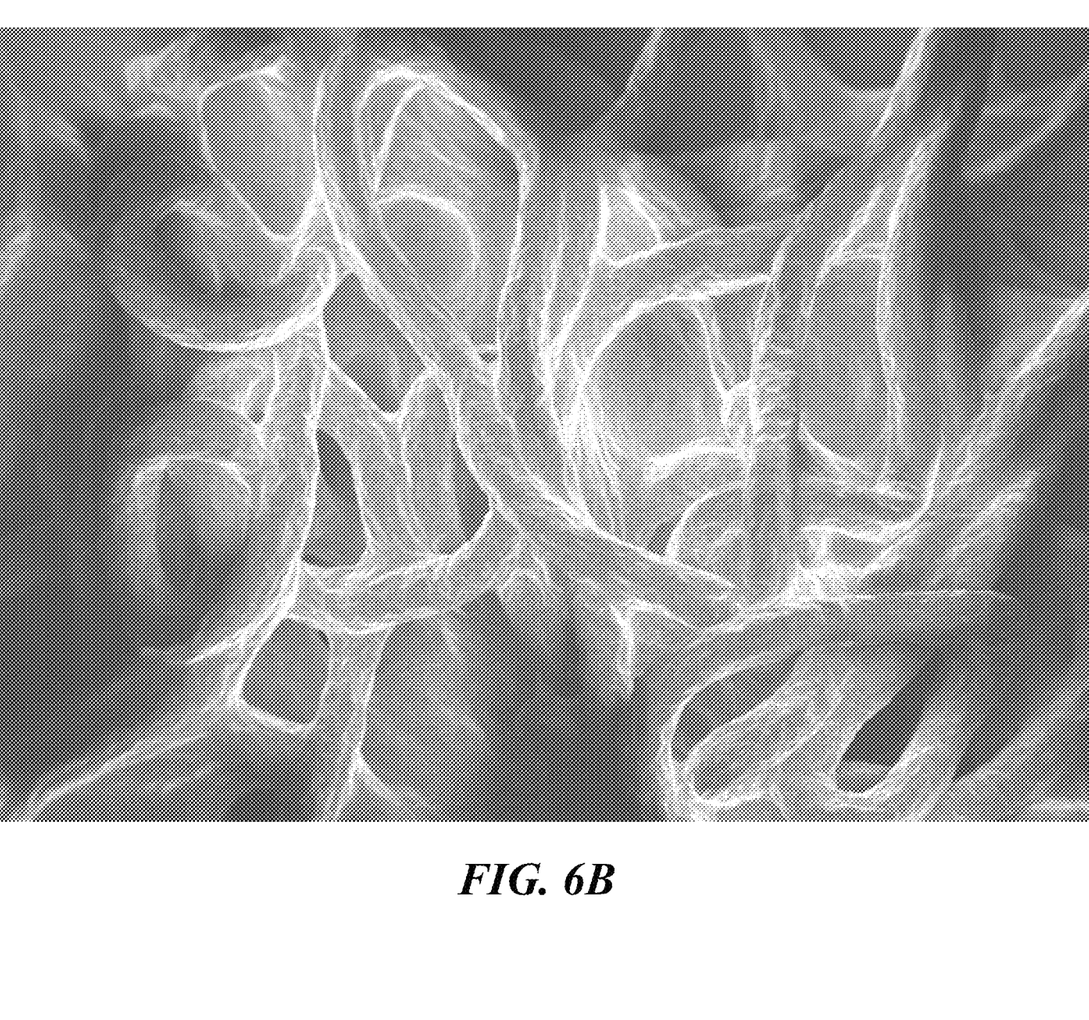
FIGS. 6B and 6C are photographs of structures formed by 3D printing with LLTO, according to some embodiments.
Figure 6C:
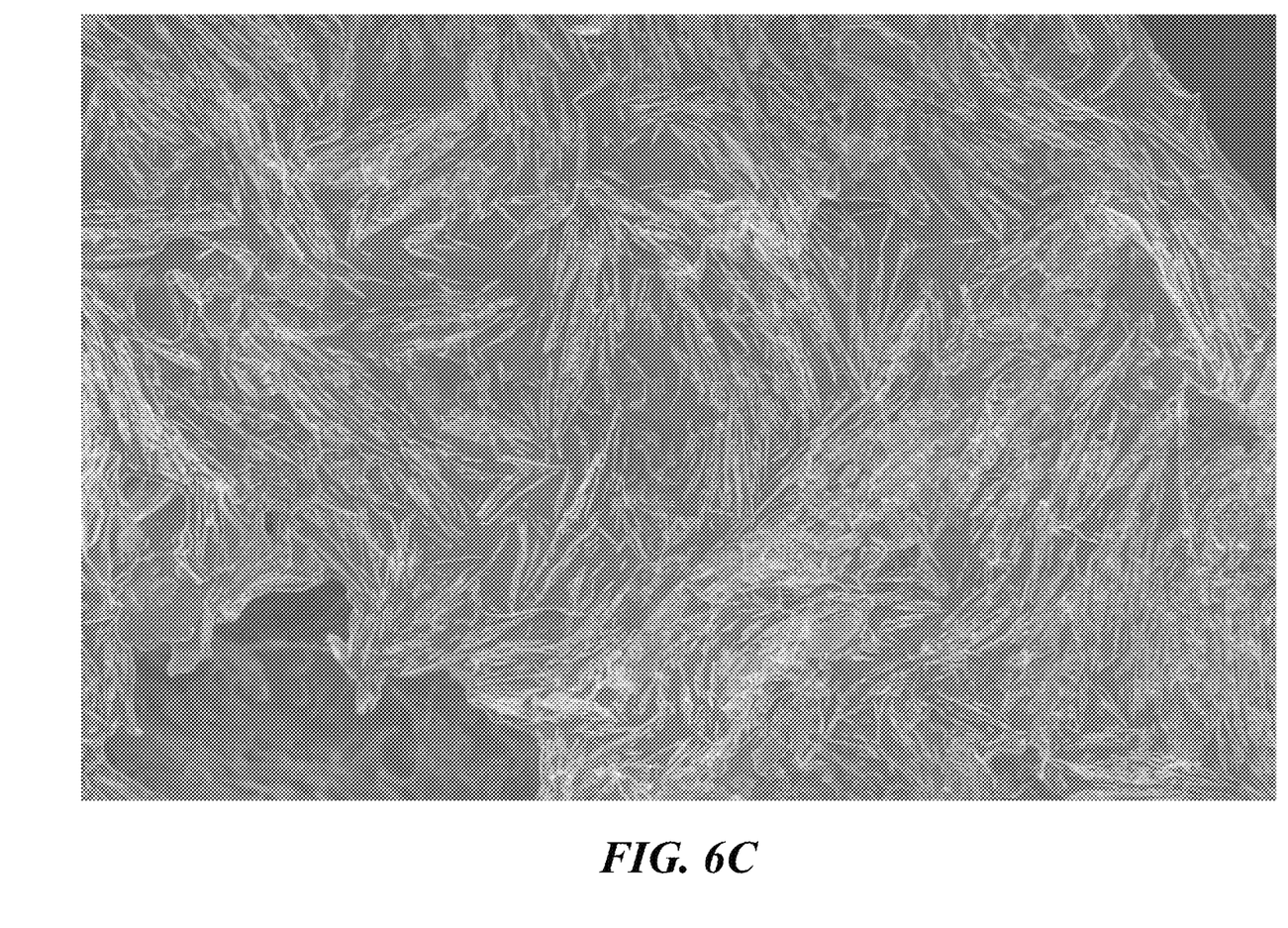

FIG. 6B shows 3D printed filaments using LLTO. FIG. 6C shows a 3D printed LLTO material with Ag flakes as a functional additive.

Figure 7:
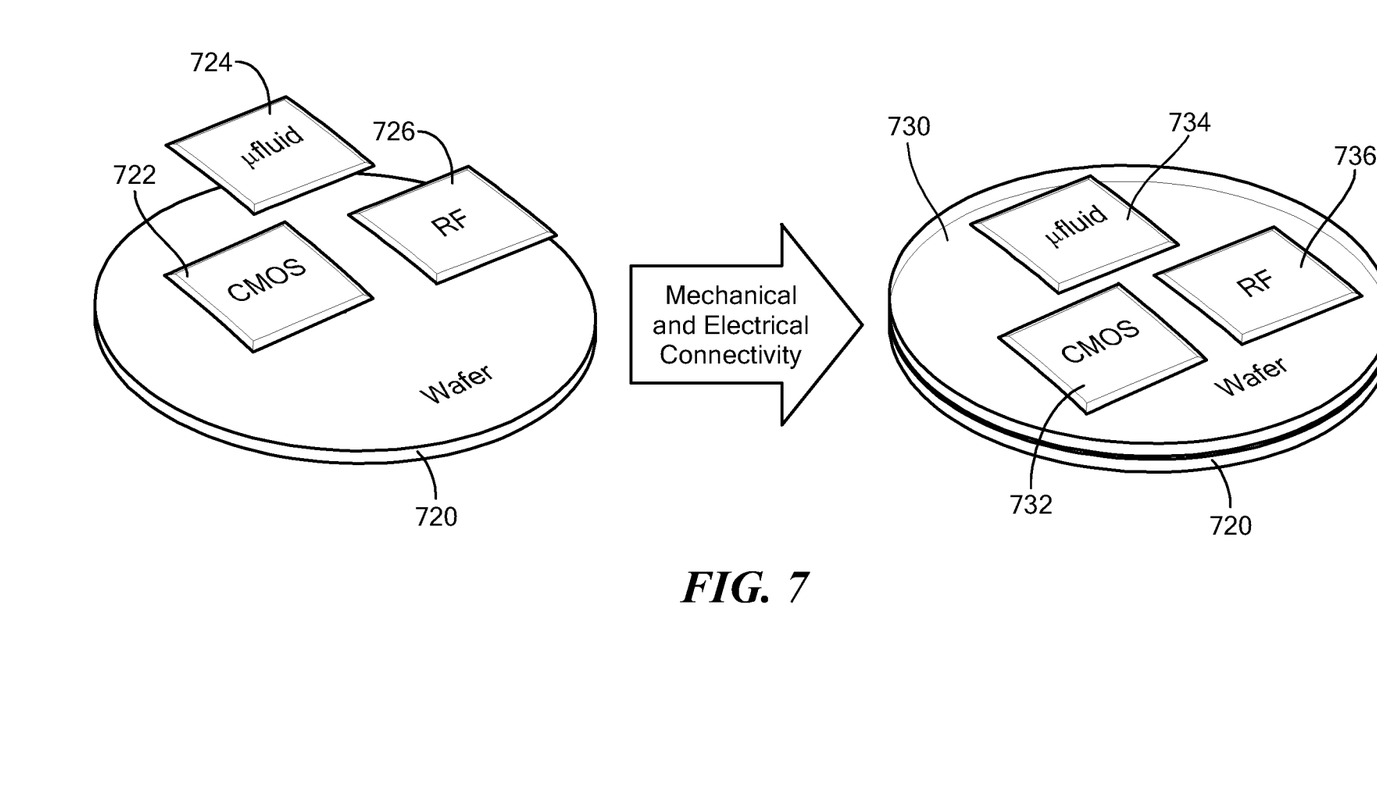
FIG. 7 is diagram showing a process for forming multi-plane integrated circuit structures using LLTO material, according to some embodiments.

Referring to FIG. 7, according to some embodiments, an LLTO material according to the present disclosure can be used to form multi-plane integrated circuit structures. One or more components can be disposed on a semiconductor wafer 720. For example, as shown in FIG. 7, a first CMOS device 722, a first microfluid circuit 724, and a first RF structure 26 can be disposed on wafer 720. The semiconductor wafer provides at least mechanical and often electrical connectivity between the components 722, 724, 726.

Next, turning to the right half of FIG. 7, an LLTO material 730 can be disposed over and directly on the wafer 720 and components 722, 724, 726. The LLTO material 730 acts as an inorganic fill and allows for planarization of the resulting integrated structure. That is, once the LLTO material 720 is cured, additional components can be disposed thereupon. For example, as shown in FIG. 7, a second CMOS device 732, a second microfluid circuit 734, and a second RF structure 736 can be disposed on the LLTO material 720. Having a planarized surface allows lithographic or bonding processes to be performed (e.g. to allow for further stacking of such structures to provide 3D IC structures). In embodiments, ceramic functional fillers may be used. In general, if a material comes in particle form and does not violently react under basic conditions, it should be possible to incorporate the material into a printable format. Depending on what functional material is included, the printed material structure (e.g. printable glass structure) will behave differently. However, all of these materials are encapsulated within a glassy silicate matrix.

It is appreciated that LLTO solutions as described herein may be deposited on a wide variety of surfaces as an effective coating, so long as the surface itself does not react with the solution in a detrimental way. For example, glass surfaces, such as ceramic silicon dioxides, are substrates that may be effectively coated using the concepts, techniques, structures, and materials disclosed herein, but other surfaces also may be effectively coated using described LLTO solutions.

Further after studying this disclosure, one of ordinary skill in the art will appreciate that the LLTO solution described herein can be deposited on a wide variety of surfaces so long as the surface does react with the silicate solution in a detrimental way. Thus, in embodiments, a glass surface, such as silicon dioxide (ceramic), may be a preferred substrate. Bare silicon may also be used, however, it should be noted that the solution will etch the surface evolving hydrogen gas and producing a porous film and thus care must be taken to avoid that result when using bare silicon as a substrate. Also, it is appreciated that many (and perhaps, most) fumed nanoparticles are classified as ceramics. It should also be appreciated that the functional fillers typically comprise metallic nanoparticles.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A method of forming a structure, the method comprising:
   forming a liquid oxide material at a low temperature by dissolving fumed nanoparticles in a liquid hydrate of a silicate or an aluminate and adding a functional additive, wherein the fumed nanoparticles have a weight percentage in the range of 0.05% to 35% and the functional additive has a weight percentage in the range of 45% to 90%, wherein the functional additive comprises one or more of a metal, ceramic, or glass particle;
   applying the liquid oxide material on a substrate by extruding the liquid oxide material as an ink within a three-dimensional (3D) printing process, wherein the ink has a viscosity in the range of $10^6$ (Pa*s) to about $10^2$ (Pa*s); and
   at a low temperature, curing the liquid oxide material to evolve gaseous water, leaving structural silicate glass.

2. The method of claim 1, wherein the fumed nanoparticles include a solid oxide solute of silicon, or of titanium, or of aluminum, or of any combination of such solutes.

3. The method of claim 1, wherein forming the liquid oxide material includes dissolving fumed nanoparticles in a liquid hydrate of sodium metasilicate or of ammonium silicate or of sodium aluminate.

4. The method of claim 1, wherein the liquid oxide material is formed at a temperature in the range of 1° to 150° C.

5. The method of claim 1, wherein the liquid oxide material is formed at a temperature in the range of 20° to 70° C.

6. The method of claim 1, wherein the fumed nanoparticles and the functional additive have a combined weight percentage in the range of 45% to 90%.

7. A method of forming a structure, the method comprising:
   forming a material at low temperature by dissolving fumed nanoparticles in a oxide precursor and adding a functional additive, wherein the fumed nanoparticles have a weight percentage in the range of 0.05% to 35% and the functional additive has a weight percentage in the range of 45% to 90%, wherein the functional additive comprises one or more of a metal, ceramic, or glass particle;
   applying the material on a substrate by extruding the liquid oxide material as an ink within a three-dimensional (3D) printing process, wherein the ink has a viscosity in the range of $10^6$ (Pa*s) to about $10^2$ (Pa*s); and
   at a low temperature, curing the material to evolve gaseous water, leaving structural silicate glass.

8. The method of claim 7, wherein the fumed nanoparticles include a solid oxide solute of silicon, or of titanium, or of aluminum, or of any combination of such solutes.

9. The method of claim 7, wherein fumed nanoparticles include fumed metallic nanoparticles and the oxide precursor includes liquid hydrate of sodium metasilicate or of ammonium silicate or of sodium aluminate.

10. The method of claim 7, wherein the material is formed at a temperature in the range of 1° to 150° C.

11. The method of claim 7, wherein the material is formed at a temperature in the range of 20° to 70° C.

* * * * *